United States Patent
Goumballa et al.

(10) Patent No.: US 10,381,051 B2
(45) Date of Patent: Aug. 13, 2019

(54) METHOD AND APPARATUS FOR GENERATING A CHARGE PUMP CONTROL SIGNAL

(71) Applicant: NXP USA, Inc., Austin, TX (US)

(72) Inventors: Birama Goumballa, Larra (FR);
Cristian Pavao Moreira, Frouzins (FR); Pierre Pascal Savary, Muret (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/616,125

(22) Filed: Jun. 7, 2017

(65) Prior Publication Data
US 2017/0358329 A1    Dec. 14, 2017

(30) Foreign Application Priority Data

Jun. 8, 2016    (EP) .................................... 16305668

(51) Int. Cl.
*G11C 5/14*    (2006.01)
*G05F 1/10*    (2006.01)
(Continued)

(52) U.S. Cl.
CPC ................ *G11C 5/145* (2013.01); *G05F 1/10* (2013.01); *H02M 3/07* (2013.01); *H03K 3/03* (2013.01);
(Continued)

(58) Field of Classification Search
CPC  G11C 5/145; G05F 1/10; H02M 3/07; H02M 3/073; H02M 2003/071;
(Continued)

(56) References Cited

U.S. PATENT DOCUMENTS

| 5,532,636 A | 7/1996 | Mar et al. |
| 6,288,660 B1 | 9/2001 | Nisbet |

(Continued)

FOREIGN PATENT DOCUMENTS

| EP | 1 870 716 A | 12/2007 |
| GB | 2333915 A | 8/1999 |

(Continued)

OTHER PUBLICATIONS

Chen, W. et al. "A Concurrent Dual-Band Uneven Doherty Power Amplifier with Frequency-Dependent Input Power Division", IEEE Transactions on Circuits and Systems I: Regular Papers, vol. 61, No. 2, pp. 552-561 (Feb. 2014).

(Continued)

*Primary Examiner* — Patrick C Chen
(74) *Attorney, Agent, or Firm* — Rajeev Madnawat

(57) ABSTRACT

A charge pump driver circuit (320) arranged to output a charge pump control signal (325). The charge pump driver circuit (320) includes a bias current source component (330) arranged to generate a bias current (335), a control stage (340) and an output stage (350). The control stage (340) is coupled to the bias current source component (330) and arranged to receive the bias current (335). The control stage (340) is further arranged to receive an input signal (215) and to generate a control current signal (345) proportional to the bias current (335) in accordance with the input signal (215). The output stage (350) is arranged to receive the control current signal (345) generated by the control stage (340) and to generate the charge pump control voltage signal (325) based on the control current signal (345) generated by the control stage (340). The bias current source component (330) is arranged to vary the bias current (335) in response to variations in temperature.

8 Claims, 5 Drawing Sheets

(51) Int. Cl.
  *H03L 7/089* (2006.01)
  *H02M 3/07* (2006.01)
  *H03K 3/03* (2006.01)
  *H02M 1/00* (2006.01)

(52) U.S. Cl.
  CPC .......... *H03L 7/0895* (2013.01); *H03L 7/0896* (2013.01); *H02M 2001/0003* (2013.01)

(58) Field of Classification Search
  CPC ..... H02M 2003/072; H02M 2003/075; H02M 2003/076; H02M 2003/077; H02M 2003/078; H03L 7/0895; H03L 7/0896
  USPC ........................................................ 327/157
  See application file for complete search history.

(56) References Cited

U.S. PATENT DOCUMENTS

| | | | |
|---|---|---|---|
| 7,061,314 | B2 | 6/2006 | Kwon et al. |
| 7,078,976 | B2 | 7/2006 | Blednov |
| 7,358,807 | B2 | 4/2008 | Scuderi et al. |
| 7,602,255 | B1 | 10/2009 | Lai et al. |
| 7,884,668 | B2 | 2/2011 | Blednov |
| 7,898,338 | B2 | 3/2011 | Blednov |
| 7,898,388 | B2 | 3/2011 | Ehrman et al. |
| 8,022,739 | B2 | 9/2011 | Yan |
| 8,160,121 | B2 | 4/2012 | Forenza et al. |
| 8,396,368 | B2 | 3/2013 | Tarlazzi et al. |
| 8,487,703 | B2 | 7/2013 | Blednov |
| 8,717,099 | B2 | 5/2014 | Wilson et al. |
| 9,077,285 | B2 | 7/2015 | Holmes |
| 9,325,324 | B1 | 4/2016 | Gupta et al. |
| 9,484,865 | B2 | 11/2016 | Kobayashi et al. |
| 9,628,093 | B2 | 4/2017 | Goumballa et al. |
| 2002/0021116 | A1* | 2/2002 | Sirito-Olivier ......... G05F 3/265 323/316 |
| 2005/0231286 | A1 | 10/2005 | Gotou et al. |
| 2006/0071716 | A1 | 4/2006 | Fang et al. |
| 2008/0018396 | A1 | 1/2008 | Mallet-Guy et al. |
| 2010/0176885 | A1 | 7/2010 | Kim et al. |
| 2010/0237944 | A1 | 9/2010 | Pierdomenico et al. |
| 2012/0218026 | A1* | 8/2012 | Nadimpalli ............ G05F 3/242 327/513 |
| 2013/0241639 | A1 | 9/2013 | Wilson et al. |
| 2014/0064394 | A1 | 3/2014 | Wang et al. |
| 2015/0145601 | A1 | 5/2015 | Moronval et al. |
| 2018/0131329 | A1 | 5/2018 | Tong |

FOREIGN PATENT DOCUMENTS

| | | |
|---|---|---|
| WO | 2014/068351 A2 | 5/2014 |
| WO | 2015008108 A1 | 1/2015 |
| WO | 2015/145601 A1 | 10/2015 |

OTHER PUBLICATIONS

Nghiem, X. A. et al. "Design of a broadband three-way sequential Doherty power amplifier for modern wireless communications", IEEE MTT-S International Microwave Symposium, 4 pgs. (2014).

U.S. Appl. No. 14/707,179, "Charge Pump Apparatus, Phase-locked Loop, and Method of Operating a Charge Pump Apparatus", filed May 8, 2015, pp. 1-26.

Non Final Office Action dated May 25, 2017 for U.S. Appl. No. 14/707,179, 10 pages.

U.S. Appl. No. 15/698,916, "Amplifier Devices With Input Line Termination Circuits", filed Sep. 8, 2017, pp. 1-40.

U.S. Appl. No. 15/299,041, "Method and Apparatus for Performing Distributed Computation of Precoding Estimates", filed Oct. 20, 2016, pp. 1-24.

Notice of Allowance dated Oct. 30, 2017 for U.S. Appl. No. 14/707,179, 7 pages.

Notice of Allowance dated Nov. 13, 2018 for U.S. Appl. No. 15/698,916, 6 pages.

Non Final Office Action dated Jul. 6, 2018 for U.S. Appl. No. 15/698,916, 6 pages.

* cited by examiner

METHOD AND APPARATUS FOR GENERATING A CHARGE PUMP CONTROL SIGNAL

CROSS-REFERENCE TO RELATED APPLICATIONS

This application claims the priority under 35 U.S.C. § 119 of European Patent application no. 16305668.2, filed on Jun. 8, 2016, the contents of which are incorporated by reference herein.

FIELD OF THE INVENTION

This invention relates to a method and apparatus for generating a charge pump control signal, and in particular to a charge pump driver circuit arranged to output a charge pump control voltage signal.

BACKGROUND OF THE INVENTION

Radar circuits often use a phase-locked loop (PLL) to generate a ramp modulated signal. In the case of a PLL with a charge pump, the charge pump is used to drive a control port of a voltage controlled oscillator (VCO).

In radar applications, phase noise is a key parameter for the system. VCOs capable of supporting long range radar (LRR) and short range radar (SRR) applications require a large tuning voltage range, for example from 0.4V to 5V. The ability of the charge pump to drive the control port of the VCO at low voltages is a limiting factor in relation to the phase noise performance of the PLL.

FIG. 1 illustrates a simplified circuit diagram of a charge pump circuit 100. The charge pump circuit consists of a bipolar transistor 110. The collector terminal of the bipolar transistor 110 is coupled to a trickle current source 120 and to an output node 105 of the charge pump circuit 100. The emitter terminal of the bipolar transistor 110 is coupled to a pulsed current source 130. A control signal 115 is provided to the base terminal of the bipolar transistor 110.

The minimum achievable voltage $V_{out}$ at the output node 105 of the charge pump circuit 100 is fixed by the minimum voltage $V_e$ at the emitter terminal of the bipolar transistor 110 and the minimum voltage Vice across the bipolar transistor 110. The voltage $V_e$ at the emitter terminal of the bipolar transistor 110 is determined by the voltage Vb at the base terminal of the bipolar transistor 110; i.e. by the control signal 115. That is, the lower the voltage $V_b$ at the base terminal of the bipolar transistor 110 (i.e. the voltage Vail of the control signal 115) the lower the voltage $V_e$ at the emitter terminal of the bipolar transistor 110 and thus the lower the achievable minimum voltage $V_{out}$ at the output node 105 of the charge pump circuit 100 while keeping acceptable phase noise performance at the PLL output.

However, too low a voltage level of the output node 105 will cause the bipolar transistor 110 to enter into its saturation region of operation, which results in baseband noise degradation of the charge pump circuit 100 and thus phase noise degradation at the PLL output. Accordingly, the minimum voltage level $V_{ctrl\_min}$ of the control signal 115 should be limited to avoid saturating the bipolar transistor 110.

Accordingly, there is a conflict between the need to achieve a low minimum voltage $V_{out}$ at the output node 105 and the need to avoid the bipolar transistor 110 being driven into its saturation mode of operation. The ability to achieve a minimum voltage $V_{out}$ at the output node 105 of the charge pump circuit 100 without driving the bipolar transistor 110 into its saturation mode of operation is further complicated by the affect that variations in temperature can have on the bipolar transistor 110. Indeed, the base-emitter voltage of the bipolar transistor 100 is inversely proportional to the absolute temperature.

SUMMARY OF THE INVENTION

The present invention provides a charge pump driver circuit, a phase-locked loop and a method of generating a charge pump control voltage signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with examples of the present invention, there is provided a charge pump driver circuit arranged to generate a charge pump control voltage signal. The charge pump driver circuit is arranged to generate a control current signal proportional to a temperature dependent bias current, and to generate the charge pump control voltage signal based on the control current signal. The bias current is arranged to be varied in response to variations in temperature such that the charge pump control voltage signal is at least partly compensated for variations in temperature. In this manner, a charge pump control voltage signal may be generated to compensate for the effects of temperature variation, such as the inversely proportional effect of temperature variations on the base-emitter voltage of the charge pump bipolar transistor.

Figure 2:
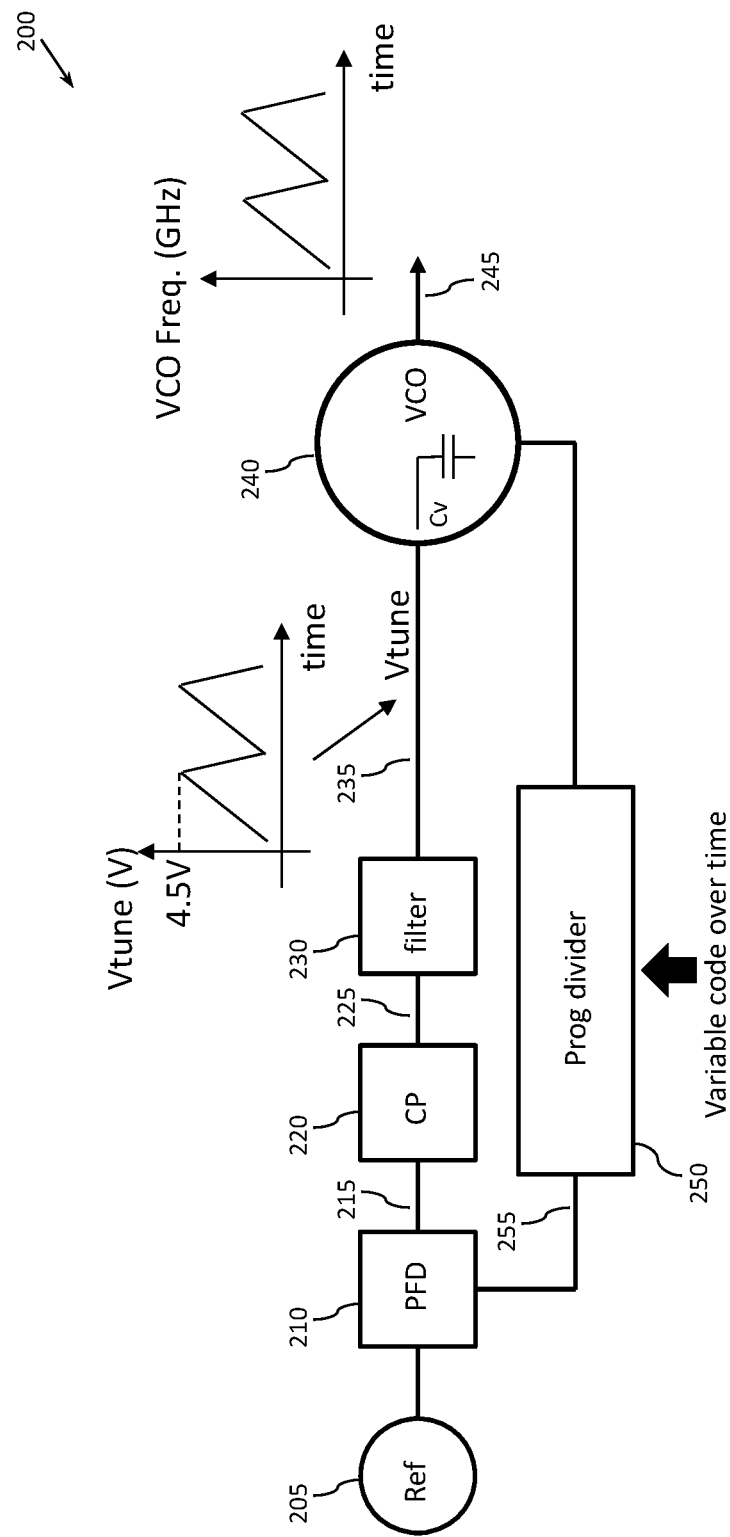
FIG. 2 illustrates a simplified block diagram of an example of a phase-locked loop.

Referring first to FIG. 2, there is illustrated a simplified block diagram of an example of a phase-locked loop (PLL) 200. The PLL 200 includes a phase detector 210, a charge pump module 220, a loop filter 230 and a voltage controlled oscillator (VCO) 240, all operably coupled in series. In response to a voltage signal 235 output by the loop filter 230 at its control port, the VCO 240 outputs an oscillating output signal 245 having an oscillation frequency dependent on the voltage signal 235. The output signal 245 is fed back to the phase detector 210 as a feedback signal 255 via a feedback path. In the illustrated example, a programmable divider 250 is provided within the feedback path and arranged to receive the output signal 245, divide the frequency of the output signal 245 by a programmed amount and output the divided frequency signal as the feedback signal 255.

The phase detector 210 compares the phase of the feedback signal 255 to the phase of a reference signal 205, and outputs a charge pump control signal 215 to the charge pump module 220. The charge pump control signal 215 generated by the phase detector 210 typically consists of voltage pulses in response to detecting phase differences between the feedback signal 255 and the reference signal 205. For example, when the frequency of the feedback signal is less than that of the reference signal 205, the phase detector 210 generates one or more 'up' pulses to raise the voltage at the control port of the VCO 240. Conversely, when the frequency of the feedback signal 255 is greater than the reference signal 205, the phase detector 210 generates one or more 'down' pulses to lower the voltage at the control port of the VCO 240. In some examples, the charge pump control signal 215 may be implemented by way of two signal paths; a first for conveying up pulses to the charge pump module 220 and a second for conveying down pulses to the charge pump module 220.

The charge pump module 220 response to voltage pulses received from the phase detector 210 by outputting a signal 225 consisting of current pulses to the loop filter 230. The loop filter 230 'averages' the current pulses to generate a DC (direct current) voltage signal 235 at the control port of the VCO 240.

Figure 1:
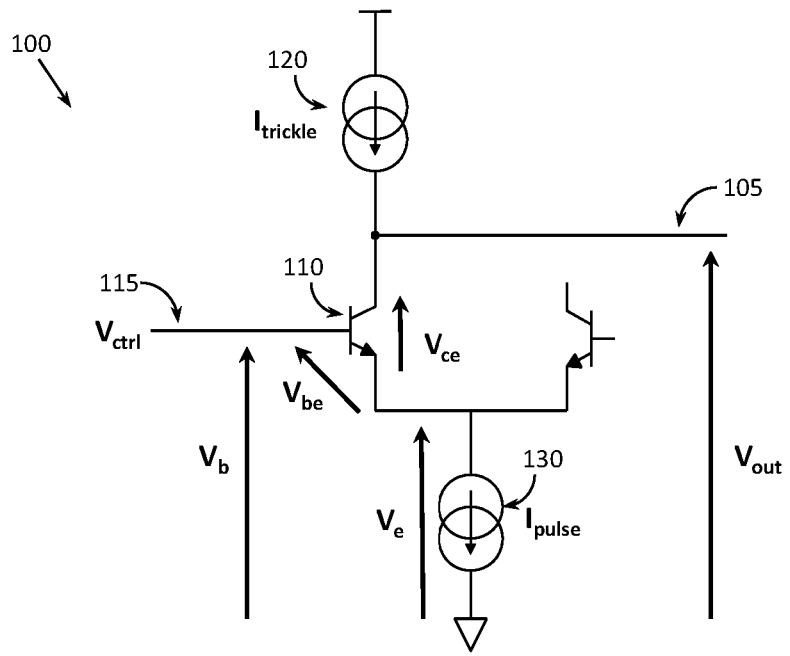
FIG. 1 illustrates a simplified circuit diagram of a charge pump circuit.
Figure 3:
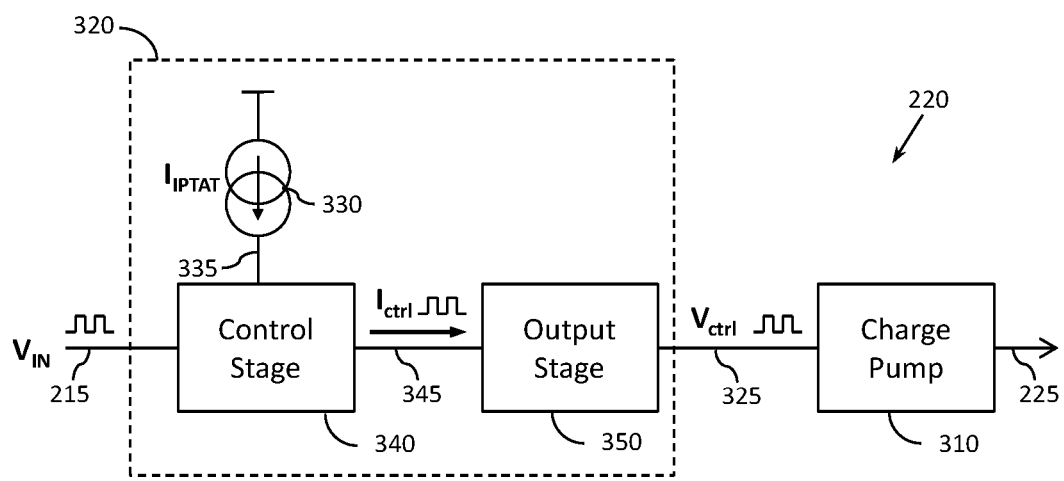
FIG. 3 illustrates a simplified block diagram of an example of a charge pump module within the phase-locked loop of FIG. 2.

Referring now to FIG. 3, there is illustrated a simplified block diagram of an example of the charge pump module 220 within the PLL of FIG. 2. The charge pump module 220 consists of a charge pump circuit 310 arranged to generate the output signal 225 used to drive the control port of the VCO 240. The charge pump module 220 further includes a charge pump driver circuit 320 arranged to output a charge pump control voltage signal 325 to the charge pump circuit 310.

The charge pump driver circuit 320 includes a bias current source component 330 arranged to generate a bias current 335 and a control stage 340 coupled to the bias current source component 330 and arranged to output a current signal 345 proportional to the bias current 335 of the bias current source component 330. The charge pump driver circuit 320 further includes an output stage 350 arranged to receive the current signal 345 output by the control stage 340 and to generate the charge pump control voltage signal 325 based on the current signal output by the control stage.

The bias current source component 330 is arranged to vary the bias current 335 generated thereby in response to variations in temperature such that the charge pump control voltage signal 325 is at least partly compensated for variations in temperature. In this manner, a voltage level for the charge pump control voltage signal 325 may be generated to compensate for the effects of temperature variation, such as the inversely proportional effect of temperature variations on the base-emitter voltage of the charge pump bipolar transistor. Advantageously, by generating the control voltage signal 325 to compensate for the effects of temperature variation, a lower minimum voltage level of the charge pump control voltage signal 325 may be configured such that a bipolar transistor within the charge pump circuit 310 is not driven into its saturation mode of operation for a given temperature range.

Figure 4:
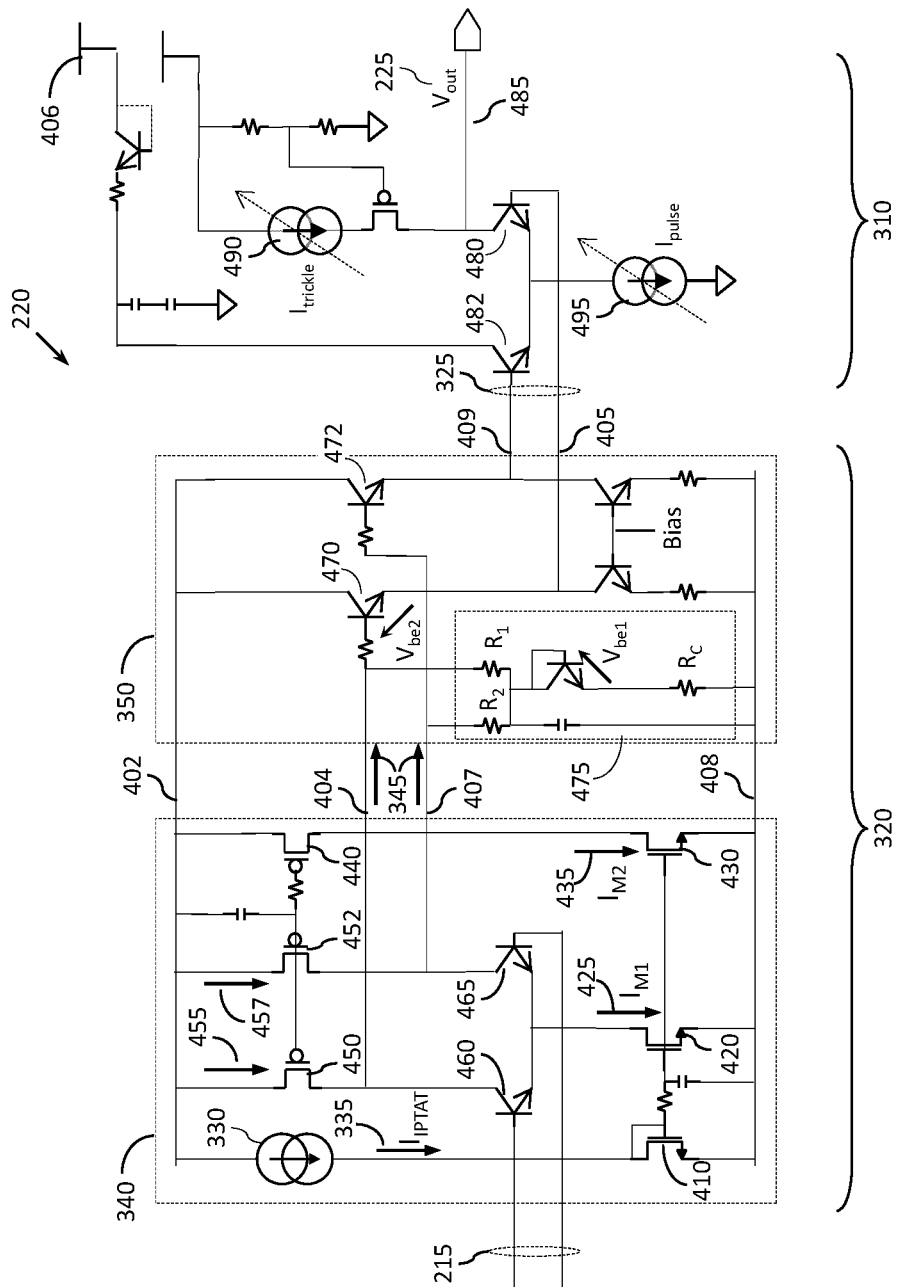
FIG. 4 illustrates a simplified circuit diagram of an example of the charge pump module of FIG. 3.

FIG. 4 illustrates a simplified circuit diagram of an example of the charge pump module 220 of FIG. 3. In the example illustrated in FIG. 4, the control stage 340 consists of a control current circuit arranged to receive a differential input signal 215 and the bias current 335 generated by the bias current source component 330, and to convert voltage pulses within the differential input signal 215 into differential current pulses comprising a constant amplitude ratio with the bias current 335. The control stage 340 is further arranged to output as the control current signal 345 the differential current pulses generated by the control current circuit.

In the illustrated example, the control current circuit includes a first current mirror arrangement consisting of a reference device 410 through which the bias current 335 flows, a first mirror device 420 through which a first mirror current 425 is regulated, and a second mirror device 430 through which a second mirror current 435 is regulated. In this manner, the first and second mirror currents 425, 435 are each regulated to have a constant amplitude ratio with the bias current 335.

The control current circuit illustrated in FIG. 4 further includes a second current mirror arrangement consisting of a reference device 440 through which the second mirror current 435 flows, a first mirror device 450 through which a first source current 455 is regulated and a second mirror device 452 through which a second current source 457 is regulated. In this manner, the source currents 455, 457 are regulated to have constant amplitudes with the second mirror current 435, and thus with the bias current 335.

The first mirror device 450 of the second current mirror arrangement is coupled between a supply node 402 and a first output node 404 of the control current circuit 340. A first bipolar transistor 460 has an emitter terminal coupled to the first mirror device 420 of the first current mirror arrangement, a collector terminal coupled to the first output node 404 of the control current circuit 340 (and thus also to the first mirror device 450 of the second current mirror arrangement) and a base terminal coupled to a first signal component of the differential input signal 215.

The second mirror device 452 of the second current mirror arrangement is coupled between the supply node 402 and a second output node 407 of the control current circuit 340. A second bipolar transistor 465 has an emitter terminal also coupled to the first mirror device 420 of the first current mirror arrangement, a collector terminal coupled to the second output node 407 of the control current circuit 340 (and thus also the second mirror device 452 of the second current mirror arrangement) and a base terminal coupled to a second signal component of the differential input signal 215.

Accordingly, and as will be apparent from FIG. 4, the bipolar transistors 460, 465 are controlled by the differential input signal 215 to selectively provide a current path for one of the first source current 455 and the second source current 457 through the first mirror device 420 of the first current mirror arrangement, whilst blocking current flow for the other of the first and second source currents 455, 457. In this manner, the source current 455, 457 for which the respective bipolar transistor 460, 465 is controlled by the differential input signal 215 to block current flow, will flow through the respective output node 404, 407 of the control current circuit 340 and provide a respective current signal for the differential control current signal 345. Thus, the bipolar transistors 460, 465 and current mirror arrangements of the control current circuit 340 are arranged to convert voltage pulses within the differential input signal 215 into corresponding current pulses within the differential control current signal 345 comprising a constant amplitude ratio with the bias current 335.

The output stage 350 includes a first bipolar transistor 470 comprising a collector terminal coupled to the supply node 402 of the charge pump driver circuit 320, an emitter terminal coupled to a first output node 405 of the charge pump driver circuit 320 and a base terminal coupled to the first output node 404 of the control current circuit 340. The output stage 350 further includes a second bipolar transistor 472 comprising a collector terminal coupled to the supply node 402 of the charge pump driver circuit 320, an emitter terminal coupled to a second output node 409 of the charge pump driver circuit 320 and a base terminal coupled to the second output node 407 of the control current circuit 340.

The output stage 350 further includes a component network 475 coupled between the output nodes 404, 407 of the control current circuit 340 and a reference voltage node 408 and arranged to convert the differential control current signal 345 generated by the control stage 320 into differential control voltage signals at the base terminals of the bipolar transistors 470, 472. In the example illustrated in FIG. 4, the component network 475 comprises a bipolar transistor coupled in series with at least one resistive element, with the base terminal thereof coupled to the collector terminal thereof. Accordingly, the voltage $V_b$ at the first output node 405 of the charge pump driver circuit 320 may be expressed as:

$$V_b = R*I_{ctrl\_1} + V_{be1} - V_{be2} = R*I_{ctrl\_1} \qquad \text{Equation 1}$$

where R represents the combined resistance ($R_1+R_c$) for the path between the first output node 405 of the charge pump driver circuit 320 and the reference voltage node 408, and $I_{ctrl\_1}$ represents the respective component of the differential control current signal 345.

Accordingly, as can be seen from Equation 1 the voltage at the first output node 405 of the charge pump driver circuit 320 is directly related to the resistance of the resistive element(s) R ($R_1+R_c$) of the component network 475 and the respective component $I_{ctrl\_1}$ of the differential control current signal 345, with the base-emitter voltages substantially cancelling each other out. Similarly, the voltage at the second output node 409 of the charge pump driver circuit 320 is directly related to the combined resistance ($R_2+R_c$) for the path between the second output node 409 of the charge pump driver circuit 320 and the reference voltage node 408, and the respective component $I_{ctrl\_2}$ of the differential control current signal 345. Notably, for the differential control current signal 345 $I_{ctrl\_1}=I_{ctrl\_2}$ for respective current pulses.

The output nodes 405, 408 of the charge pump driver circuit 320 are coupled to the charge pump circuit 310 and from which the differential charge pump control voltage signal 325 is provided. The charge pump circuit 310 consists of a first bipolar transistor 480 and a second bipolar transistor 482. The collector terminal of the first bipolar transistor 480 is coupled to a trickle current source 490 and to an output node 485 of the charge pump circuit 310. The emitter terminal of the first bipolar transistor 480 is coupled to a pulsed current source 495. A first component of the differential charge pump control voltage signal 325 from the first output node 405 of the charge pump driver circuit 320 is provided to the base terminal of the first bipolar transistor 480. The collector terminal of the second bipolar transistor 482 is coupled to a supply node 406 of the charge pump circuit 310 via a low pass filter circuit. The emitter terminal of the second bipolar transistor 482 is also coupled to the pulsed current source 495. A second component of the differential charge pump control voltage signal 325 from the second output node 409 of the of the charge pump driver circuit 320 is provided to the base terminal of the second bipolar transistor 482.

As described above, the control current circuit 340 converts voltage pulses within the input signal 215 into current pulses within the control current signal 345 comprising a constant amplitude ratio with the bias current 335. Thus, by varying the bias current 335 in response to variations in temperature, the temperature related variations to the bias current 335 effect the amplitude of the pulses within control current signal $I_{ctrl}$ 345, and thus the corresponding voltage level at the output nodes 405, 408 of the charge pump driver circuit 320. In particular, the voltage levels for the differential charge pump control voltage signal 325 may be generated to compensate for the effects of temperature variation, such as the inversely proportional effect of temperature variations on the base-emitter voltage of the charge pump bipolar transistors 480, 482. Advantageously, by generating the control voltage signal 325 to compensate for the effects of temperature variation, a lower minimum voltage level of the charge pump control voltage signals 325 may be configured such that the bipolar transistors 480, 482 within the charge pump circuit 310 are not driven into their saturation mode of operation for a given temperature range.

Figure 5:
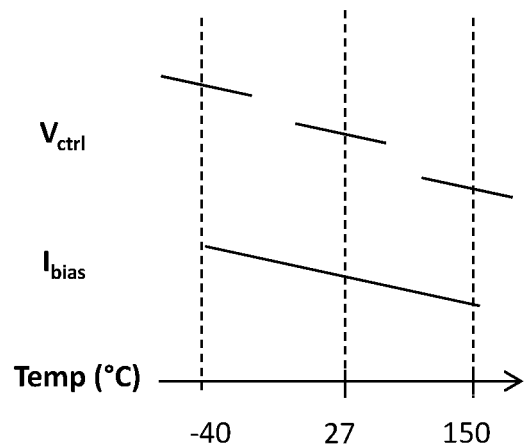
FIGS. 5 and 6 illustrates examples of bias current temperature profiles.

In accordance with some example embodiments, the bias current source component 330 may be arranged to generate a bias current 335 having a negative slope temperature profile. For example, and as illustrated in FIG. 5, the bias current source component 330 may be arranged to generate a bias current $I_{bias}$ 335 having a substantially linear negative slope temperature profile.

Figure 6:
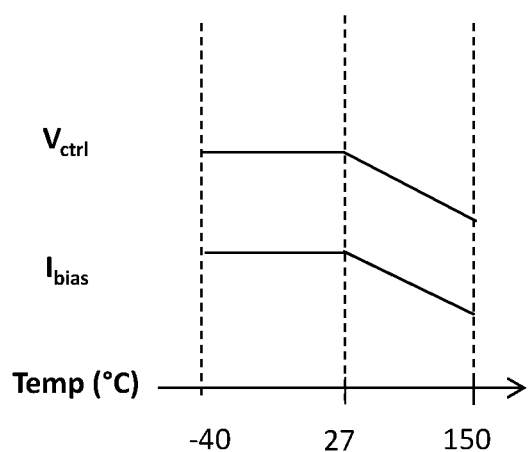

In accordance with some alternative example embodiments, the bias current source component 330 may be arranged to generate a bias current 335 having a multi-region temperature profile. For example, and as illustrated in FIG. 6, the bias current source component 330 may be arranged to generate a bias current $I_{bias}$ 335 having a substantially flat lower temperature profile region and a substantially linear negative slope upper temperature profile region.

In accordance with some example embodiments, the bias current source component 330 is arranged to generate the bias current 335 comprising a current component inversely proportional to absolute temperature (IPTAT).

Figure 7:
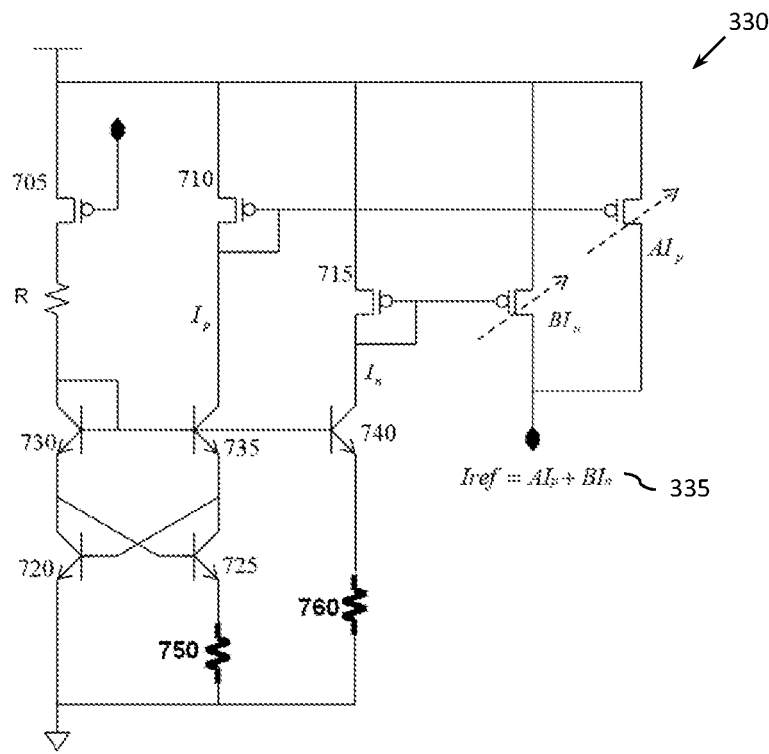
FIG. 7 illustrates a simplified circuit/block diagram of an example of a bias current source component.

FIG. 7 illustrates a schematic diagram showing an example of the bias current source component 330. The bias current 335 is generated by combining a proportional to the absolute temperature (PTAT) current Ip and an inverse proportional to the absolute temperature (IPTAT) current In. The current source generation is based on ΔVBE/R or VPTAT/R to generate the PTAT current Ip and the inverse (IPTAT) current In that form the bias current 335.

Referring to FIG. 7, using a plurality of MOSFET devices, 705, 710 and 715, the PTAT current Ip is generated through resistor R1 750 using a voltage output from transistors 720, 725, 730 and 735. The IPTAT current In is generated through resistor R2 760 using a voltage output from transistors 720, 735 and 740.

The PTAT current Ip and IPTAT current In are the resultant currents used to generate the bias current 335. The bias current 335 may be represented by Iref=A*Ip+B*In, where A is a first multiplier, and B is a second multiplier.

Depending on the ratio B/A, the bias current 335 Iref could be a PTAT current or IPTAT current. In the specific charge pump application illustrated in FIGS. 3 and 4, the ratio B/A is set to generate an IPTAT current to compensate the charge pump control voltage with respect to temperature.

To produce the currents Ip and In in FIG. 7, the following formulas are used: Ip is a PTAT current that is proportional to absolute temperature and is derived from the equation Ip=$\Delta$Vbe(a)/R1, where $\Delta$Vbe(a)=Vbe1+Vbe4 Vbe3 Vbe2. The inverse PTAT current In is derived from the equation In=Vbe(b)/R2, where Vbe(b)=Vbe1+Vbe4 Vbe5. Vbe1 is the voltage of a base-emitter junction of transistor 720. Vbe2 is the voltage of a base-emitter junction of transistor 725. Vbe3 is the voltage of a base-emitter junction of transistor 730. Vbe4 is the voltage of a base-emitter junction of transistor 735. Vbe5 is the voltage of a base-emitter junction of transistor 740.

Figure 8:
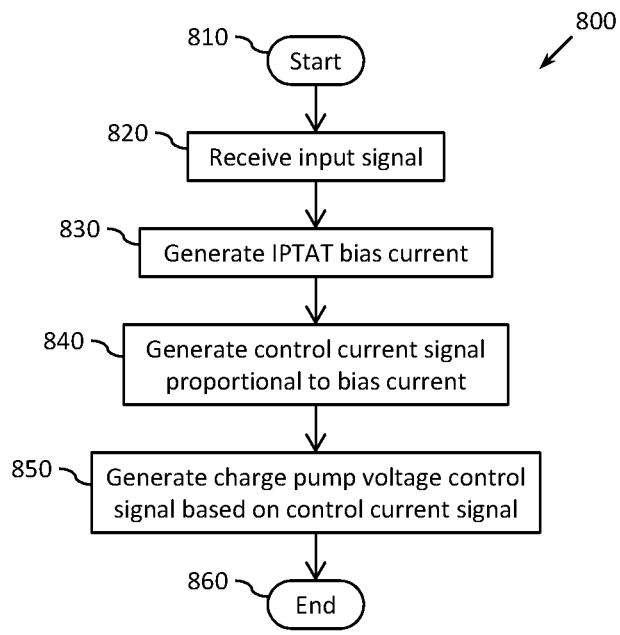
FIG. 8 illustrates a simplified flowchart of an example of a method of generating a charge pump control voltage signal.

Referring now to FIG. 8, there is illustrated a simplified flowchart 800 of an example of a method of generating a charge pump control voltage signal, such as may be implemented within the charge pump driver circuit 320 of FIG. 3. The method starts at 810, and moves on to 820 where an input signal is received. A temperature dependent bias current is generated at 830, which in the illustrated example includes an IPTAT current component. A control current signal proportional to the temperature dependent bias current is then generated in accordance with the input signal, at 840. The charge pump control voltage signal is then generated based on the control current signal at 850. This method ends at 860.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details have not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A charge pump driver circuit arranged to output a charge pump control voltage signal, the charge pump driver circuit comprising:
   a bias current source component arranged to generate a bias current;
   a control stage coupled to the bias current source component and arranged to receive the bias current, the control stage is further arranged to receive an input signal and to generate a control current signal proportional to the bias current in accordance with the input signal, wherein the control stage is configured to output current pulses having a constant amplitude ratio with the bias current; and
   an output stage arranged to receive the control current signal generated by the control stage and to generate the charge pump control voltage signal based on the control current signal generated by the control stage, wherein the bias current source component is arranged to vary the bias current in response to variations in temperature, and the bias current has a multi-region temperature profile having a lower temperature profile region comprising a linear temperature invariant slope and an upper temperature profile region comprising a linear negative slope, wherein the lower temperature profile region extends below a first temperature, and the upper temperature profile region extends above the first temperature.

2. The charge pump driver circuit of claim 1, wherein the control stage comprises a control current circuit arranged to receive the input signal and the bias current generated by the bias current source component and to convert voltage pulses within the input signal into the current pulses.

3. The charge pump driver circuit of claim 2, wherein the control current circuit comprises:
   a first current mirror arrangement comprising a reference device through which the bias current flows, a first mirror device through which a first mirror current is regulated, and a second mirror device through which a second mirror current is regulated;
   a second current mirror arrangement comprising a reference device through which the second mirror current flows, and a mirror device through which a source current is regulated, the mirror device of the second current mirror arrangement being coupled between a supply node and an output node of the control current circuit; and
   a bipolar transistor having an emitter terminal coupled to the first mirror device of the first current mirror arrangement, a collector terminal coupled to the output node of the control current circuit and a base terminal coupled to the input signal.

4. The charge pump driver circuit of claim 1, wherein the output stage comprises:
   a bipolar transistor comprising a collector terminal coupled to a supply node of the charge pump driver circuit, an emitter terminal coupled to an output node of the charge pump driver circuit and a base terminal operably coupled to an output node of a control current circuit in the control stage; and
   a component network coupled between the output node of the control current circuit and a reference voltage node and arranged to convert the control current signal generated by the control stage into a control voltage signal at the base terminal of the bipolar transistor.

5. The charge pump driver circuit of claim 4, wherein the component network comprises a bipolar transistor coupled in series with at least one resistive element, with a base terminal thereof coupled to a collector terminal thereof.

6. The charge pump driver circuit of claim 1, wherein the bias current source component is arranged to generate the bias current having a negative slope temperature profile.

7. The charge pump driver circuit of claim 1, wherein the bias current source component is arranged to generate the bias current comprising a current component inversely proportional to absolute temperature.

8. A phase-locked loop, comprising a charge pump circuit and a charge pump driver circuit according to claim 1, arranged to output a charge pump control voltage signal to the charge pump circuit.

* * * * *